United States Patent [19]
Chen et al.

[11] Patent Number: 6,100,137
[45] Date of Patent: Aug. 8, 2000

[54] ETCH STOP LAYER USED FOR THE FABRICATION OF AN OVERLYING CROWN SHAPED STORAGE NODE STRUCTURE

[75] Inventors: Yue-Feng Chen, Hsin-Chu; Liang-Gi Yao, Taipei; Guei-Chi Guo, Taichung; Hung-Yi Luo, Taipei, all of Taiwan

[73] Assignee: Vanguard International Semiconductor Corporation, Hsin-Chu, Taiwan

[21] Appl. No.: 09/373,247

[22] Filed: Aug. 12, 1999

[51] Int. Cl.[7] .................................................. H01L 21/8242
[52] U.S. Cl. ........................................... 438/253; 438/396
[58] Field of Search .................................. 438/397, 396, 438/398, 253, 254, 255, 256; 148/FOR 220, FOR 212

[56] References Cited

U.S. PATENT DOCUMENTS

| | | | |
|---|---|---|---|
| 5,286,667 | 2/1994 | Lin et al. | 438/253 |
| 5,418,180 | 5/1995 | Brown | 438/398 |
| 5,518,948 | 5/1996 | Walker | 438/396 |
| 5,936,272 | 8/1999 | Lee | 257/306 |
| 5,956,587 | 9/1999 | Chen et al. | 438/255 |
| 6,022,776 | 2/2000 | Lien et al. | 438/396 |
| 6,037,211 | 3/2000 | Jeng et al. | 438/253 |
| 6,037,215 | 3/2000 | Lee et al. | 438/253 |

*Primary Examiner*—Michael Trinh
*Attorney, Agent, or Firm*—George O. Saile; Stephen B. Akerman

[57] ABSTRACT

A process for creating a crown shaped storage node structure, for a DRAM capacitor structure, featuring the use of a silicon oxynitride layer, underlying the crown shaped storage node structure, has been developed. A silicon oxynitride layer is placed overlying the interlevel dielectric layers that used to protect underlying DRAM elements, and placed underlying a capacitor opening in an overlying insulator layer. A selective RIE procedure is used to create the capacitor opening, in an insulator layer, with the RIE procedure terminating at the exposure of the underlying silicon oxynitride layer. After creation of the crown shaped storage node structure, in the capacitor opening, overlying the silicon oxynitride layer at the bottom of the capacitor opening, the insulator layer used for formation of the capacitor opening, is selectively removed from the regions of silicon oxynitride layer, not covered by the overlying crown shaped storage node structure, using wet etch procedures.

33 Claims, 13 Drawing Sheets

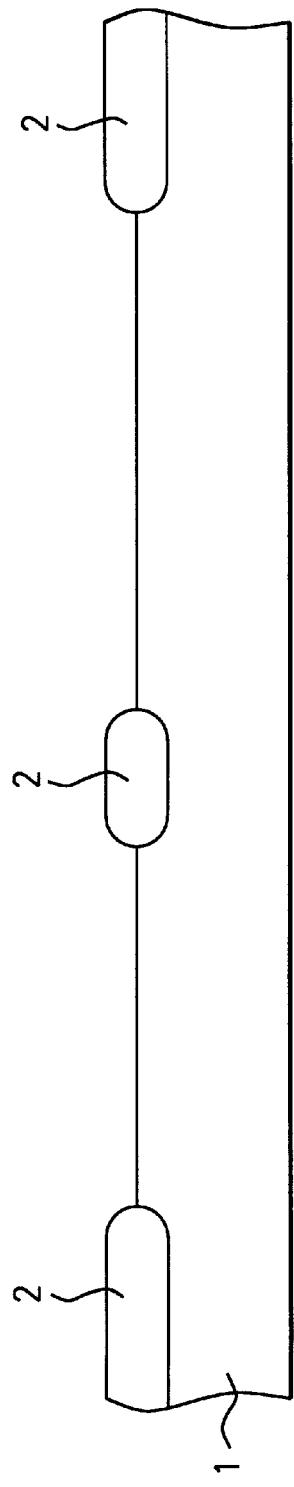
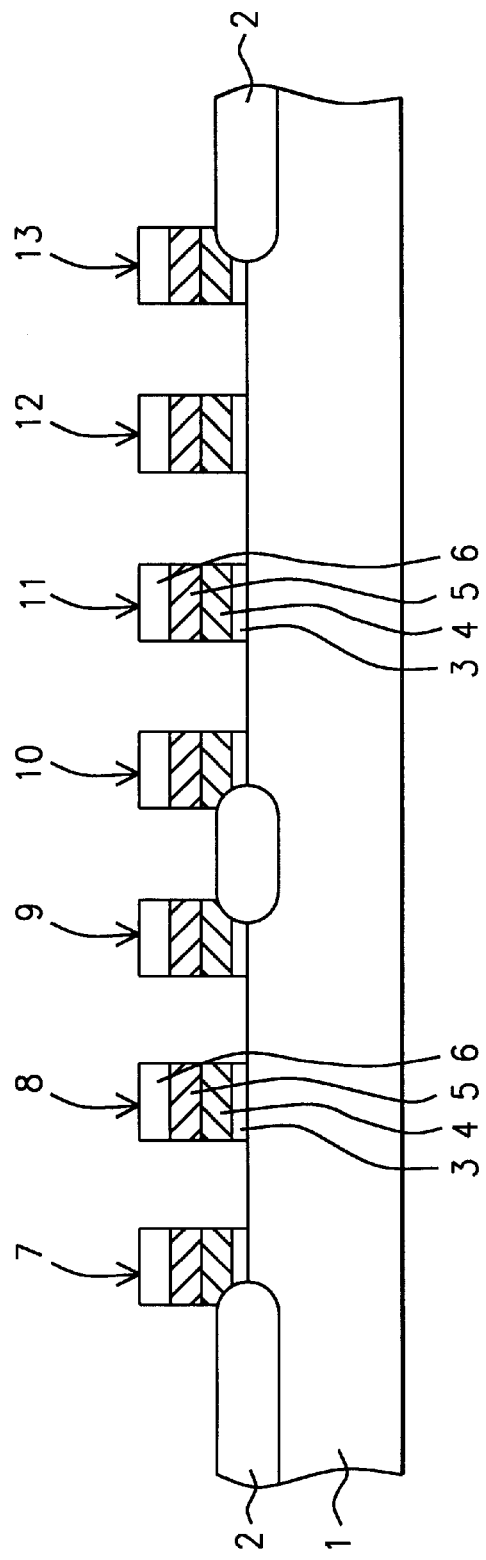

ETCH STOP LAYER USED FOR THE FABRICATION OF AN OVERLYING CROWN SHAPED STORAGE NODE STRUCTURE

BACKGROUND OF THE INVENTION (1) Field of the Invention

The present invention relates to a process used to create a crown shaped capacitor structure, for high density dynamic random access memory, (DRAM), circuits.

(2) Description of the Prior Art

The semiconductor industry is continually striving to improve semiconductor device performance, while still attempting to reduce the manufacturing costs of these semiconductor devices. These objectives have been in part realized by the ability of the semiconductor industry to fabricate semiconductor memory chips, using sub-micron features. The use of sub-micron features, or micro-miniaturization, results in reductions of performance degrading capacitances and resistances. In addition the use of smaller features result in a smaller chip, however still possessing the same level of integration obtained for larger semiconductor chips, fabricated with larger features. This allows a greater number of the denser, smaller chips to be obtained from a specific size starting substrate, thus resulting in a lower manufacturing cost for an individual chip.

The use of sub-micron features however, in some areas, can adversely influence the performance of a DRAM device. The DRAM device is usually comprised of a stacked capacitor, (STC), structure, overlying a transfer gate transistor, and connected to the source of the transfer gate transistor. However the decreasing size of the transfer gate transistor, limits the dimensions of the STC structure. To increase the capacitance, and thus the performance of STC structure, comprised of two electrodes, separated by a dielectric layer, either the thickness of the dielectric layer has to be decreased, or the area of the capacitor has to be increased. The reduction in dielectric thickness is limited by increasing reliability and yield risks, encountered with ultra thin dielectric layers. In addition the area of the STC structure is limited by the area of the underlying transfer gate transistor dimensions. The advancement of the DRAM technology to densities of 256 million cells per chip, or greater, has resulted in a specific cell in which a smaller transfer gate transistor is being used, resulting in less of an overlying area, available for the placement of an overlying STC structure.

One method of maintaining, or increasing STC capacitance, while still decreasing the lateral dimension of the capacitor, has been the use of a capacitor structure, featuring a crown shaped storage node structure, comprised of vertical features of silicon, connected to a horizontal silicon feature, with the horizontal silicon feature, overlying and contacting, the top surface of a storage node contact plug, which in turn contacts a source region of an underlying transfer gate transistor. The increased surface area, presented by the vertical features of the crown shaped structure, results in an increase in capacitance, without increasing the lateral dimensions of the capacitor structure. The crown shaped storage node structure can be formed by initially forming a capacitor opening, in an insulator layer, followed by the deposition and patterning of a polysilicon layer, creating a polysilicon, crown shaped storage node structure, located on the exposed surfaces of the capacitor opening. The procedure of forming a capacitor opening, in an insulator layer, is accomplished overlying a second insulator layer, with the capacitor opening procedure, having to selectively stop, or end point, on the second insulator layer. Attack, or removal of second insulator layer, during the capacitor opening procedure, can not be tolerated since the second insulator layer is used to protect underlying elements of the DRAM cell.

This invention will describe a novel process sequence for creating a crown shaped storage node structure, for a DRAM device, featuring the use of a silicon oxynitride, $(SiO_xN_y)$ layer, used as the stop layer, at the conclusion of the capacitor opening procedure, with the $SiO_xN_y$ layer overlying, and protecting the underlying insulator layers that are used for the passivation of specific DRAM cell elements. Prior art, such as Walker, in U.S. Pat. No. 5,518,948, describes the use of a silicon nitride stop layer, used in the capacitor fabrication sequence. However the use of silicon oxynitride offers several advantages over the prior art, such as: an improved anti-reflective coating, (ARC), during the photolithographic portion of the capacitor node contact opening procedure; improved endpoint detection, at the conclusion of the capacitor opening procedure; reduced stress in the BPSG layer, reducing the possibility of film cracks on the BPSG layer; a diffusion barrier for the crown shaped storage node structure from underlying doped insulator layer; and reduced loading phenomena, during the dry etching procedure, used for the capacitor opening.

SUMMARY OF THE INVENTION

It is an object of this invention to create a crown shaped storage node structure, to increase the surface area of a DRAM capacitor structure.

It is another object of this invention to form the shape of a crown shaped storage node structure, via deposition and patterning, of a polysilicon layer, located on the surfaces of a capacitor opening, in an insulator layer.

It is still another object of this invention to use a silicon oxynitride layer, as a stop layer, during the creation of the capacitor opening, in an insulator layer.

In accordance with the present invention a method for forming a crown shaped storage node structure, featuring the use of a silicon oxynitride layer, used as an etch stop layer, during the creation of a capacitor opening in an overlying thick insulator layer, has been developed. After creation of transfer gate transistors, each comprised of: a thin gate insulator; a silicon nitride capped, polycide, (metal silicide—polysilicon), gate structure, a lightly doped source/drain region; silicon nitride spacers on the sides of the silicon nitride capped, polycide gate structure; and a heavily doped source/drain region; a first insulator is deposited and planarized, followed by the deposition of a second insulator layer. After the opening of contact holes, in the second insulator layer, and in the first insulator layer, exposing source/drain regions, between transfer gate transistors, lower level polysilicon plugs, to be used as a component for subsequent bit line contact structures, and for subsequent storage node contact structures, are formed in the contact holes. Bit line contact holes are next formed in an overlying third insulator layer, exposing the specific underlying, lower level polysilicon plugs, that will be used for the bit line structures. After creation of the metal bit line structures, located in the bit line contact holes, as well as located overlying a portion of the top surface of the third insulator layer, a fourth insulator layer is deposited, followed by the deposition of an overlying silicon oxynitride layer. Openings are made in the silicon oxynitride layer, in the fourth insulator layer, and in the third insulator layer, exposing the top surface of the lower level, polysilicon plugs, used specifically for storage node contacts. Upper level, polysilicon plugs are then formed in the upper level openings, creating the storage node contact structures, comprised of the upper level, polysilicon plugs, and the underlying, lower level, polysilicon plugs. A fifth insulator layer is next deposited followed by photolithographic and dry etching procedures, used to create a capacitor opening in the fifth insulator layer, exposing the top surface of the storage node contact structure, as well as exposing the top surface of the silicon oxynitride layer. After deposition of a polysilicon layer, a chemical mechanical procedure is used to remove the polysilicon layer from the top surface of the fifth insulator layer, resulting in the crown shaped storage node structure, located in the capacitor opening, and comprised of vertical polysilicon shapes, on the sides of the fifth insulator layer, of the capacitor opening, with the vertical polysilicon shapes, connected by a horizontal polysilicon shape, which overlays, and contacts, the top surface of the storage node contact structure, and overlays the silicon oxynitride layer, at the bottom of the capacitor opening. After selective removal of the fifth insulator layer, stopping at the top surface of the underlying silicon oxynitride layer, a capacitor dielectric layer is formed on the crown shaped storage node structure, followed by the creation of an overlying polysilicon upper electrode, completing the process used the creation of the DRAM capacitor structure.

BRIEF DESCRIPTION OF THE DRAWINGS

The object and other advantages of this invention are best explained in the preferred embodiment with reference to the attached drawings that include:

FIGS. 1–15, which schematically, in cross-sectional style, show the key fabrication stages used to create a crown shaped storage node structure, for a DRAM capacitor structure, featuring a silicon oxynitride layer, used as a stop layer, for optimization of a capacitor opening patterning procedure, which in turn is used as a pattern for creation of the crown shaped storage node structure.

DESCRIPTION OF THE PREFERRED EMBODIMENTS

Figure 3:
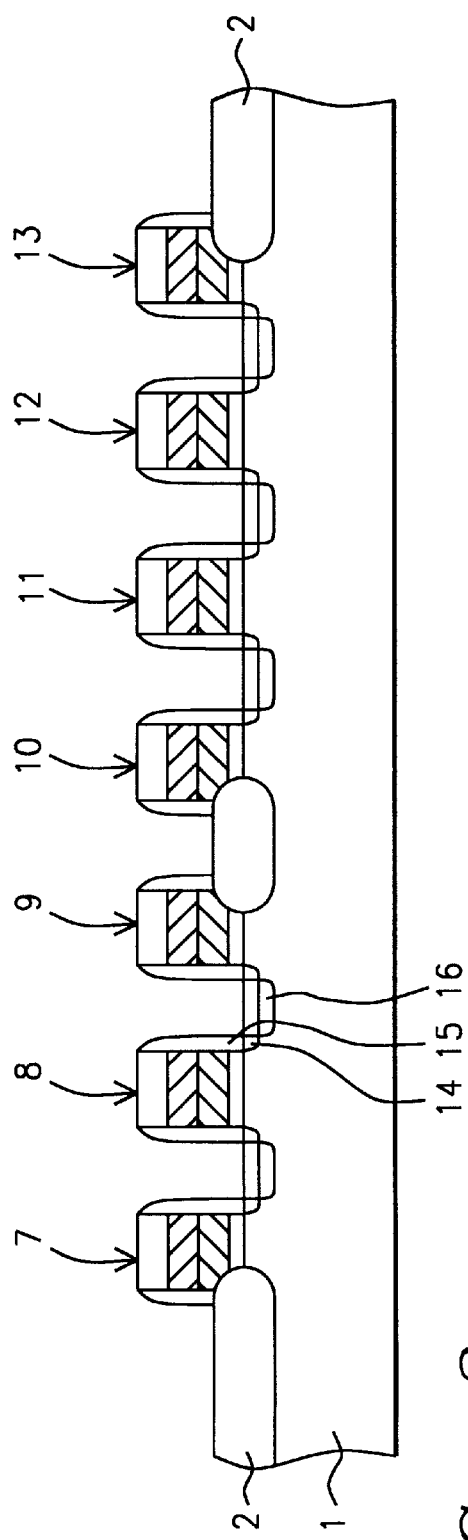

The method of forming a crown shaped storage node structure, for a DRAM capacitor, featuring a silicon oxynitride layer, used as the etch stop layer, during the creation of a capacitor opening in an overlying silicon oxide layer, will now be described in detail. The transfer gate transistor, used for the DRAM device, in this invention, will be an N channel device. However this invention can be applied to DRAM cells, comprised of P channel, transfer gate transistor.

Referring to FIG. 1, a P type, semiconductor substrate 1, with a <100>, single crystalline orientation, is used. Field oxide, (FOX), regions 2, used for isolation purposes, are formed via thermal oxidation procedures, using a patterned oxidation resistant mask, such as a silicon nitride—silicon oxide composite insulator layer, to protect subsequent device regions from the oxidation procedure. Insulator filled, shallow trench regions, can also be used for the isolation regions, if desired. After formation of FOX regions 2, at a thickness between about 2000 to 5000 Angstroms, the composite insulator layer is removed, using hot phosphoric acid for silicon nitride, while a buffered hydrofluoric acid solution is used for the underlying silicon oxide layer. After a series of wet cleans, a gate insulator layer 3, of silicon oxide is thermally grown in an oxygen-steam ambient, at a temperature between about 750 to 1050° C., to a thickness between about 40 to 200 Angstroms. A polysilicon layer 4, shown schematically in FIG. 2, is next deposited using low pressure chemical vapor deposition, (LPCVD), procedures, at a temperature between about 500 to 700° C., to a thickness between about 500 to 3000 Angstroms. The polysilicon can either be grown intrinsically and doped via ion implantation of arsenic or phosphorous, at an energy between about 10 to 80 KeV, and using a dose between about 1E13 to 1E16 atoms/cm$^2$, or the polysilicon layer can be grown using in situ doping procedures, via the incorporation of either arsine or phosphine to the silane or disilane ambient. A metal silicide layer 5, comprised of tungsten silicide, is next deposited, via LPCVD procedures, to a thickness between about 500 to 3000 Angstroms, using silane and tungsten hexafluoride as a source, creating a polycide layer, comprised of metal silicide layer 5, overlying polysilicon layer 4. An insulator layer 6, comprised of silicon nitride, and used as a cap insulator layer, is next grown via the use of either LPCVD or plasma enhanced chemical vapor deposition, (PECVD), procedures to a thickness between about 600 to 2000 Angstroms. Conventional photolithographic and reactive ion etching, (RIE), procedures, using $CF_4$ as an etchant for insulator layer 6, and using $Cl_2$ as an etchant for metal silicide layer 5, and for polysilicon layer 4, are used to create the silicon nitride capped, polycide gate structures 7–13, schematically shown in FIG. 2. Removal of the photoresist shape, used for polycide gate patterning, is accomplished via plasma oxygen ashing and careful wet cleans.

A lightly doped source/drain region 14, is next formed via ion implantation of phosphorous, at an energy between about 5 to 60 KeV, at a dose between about 1E13 to 1E15 atoms/cm$^2$. An insulator layer, comprised of silicon nitride, is then deposited using either LPCVD or PECVD procedures, at a temperature between about 400 to 850° C., to a thickness between about 1500 to 4000 Angstroms, followed by an anisotropic RIE procedure, using $CF_4$ as an etchant, creating silicon nitride spacers 15, on the sides of the silicon nitride capped, polycide gate structures 7–13. A heavily doped source/drain region 16, is then formed via ion implantation of arsenic, at an energy between about 30 to 100 KeV, at a dose between about 1E14 to 5E16 atoms/cm$^2$. The result of these steps are also shown schematically in FIG. 3.

Figure 4:
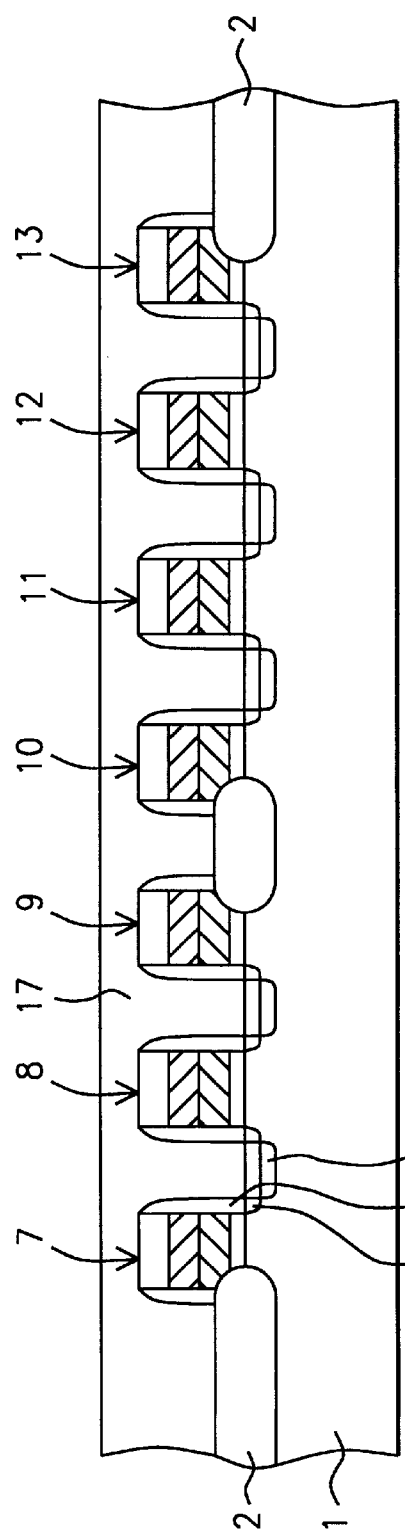
Figure 5:
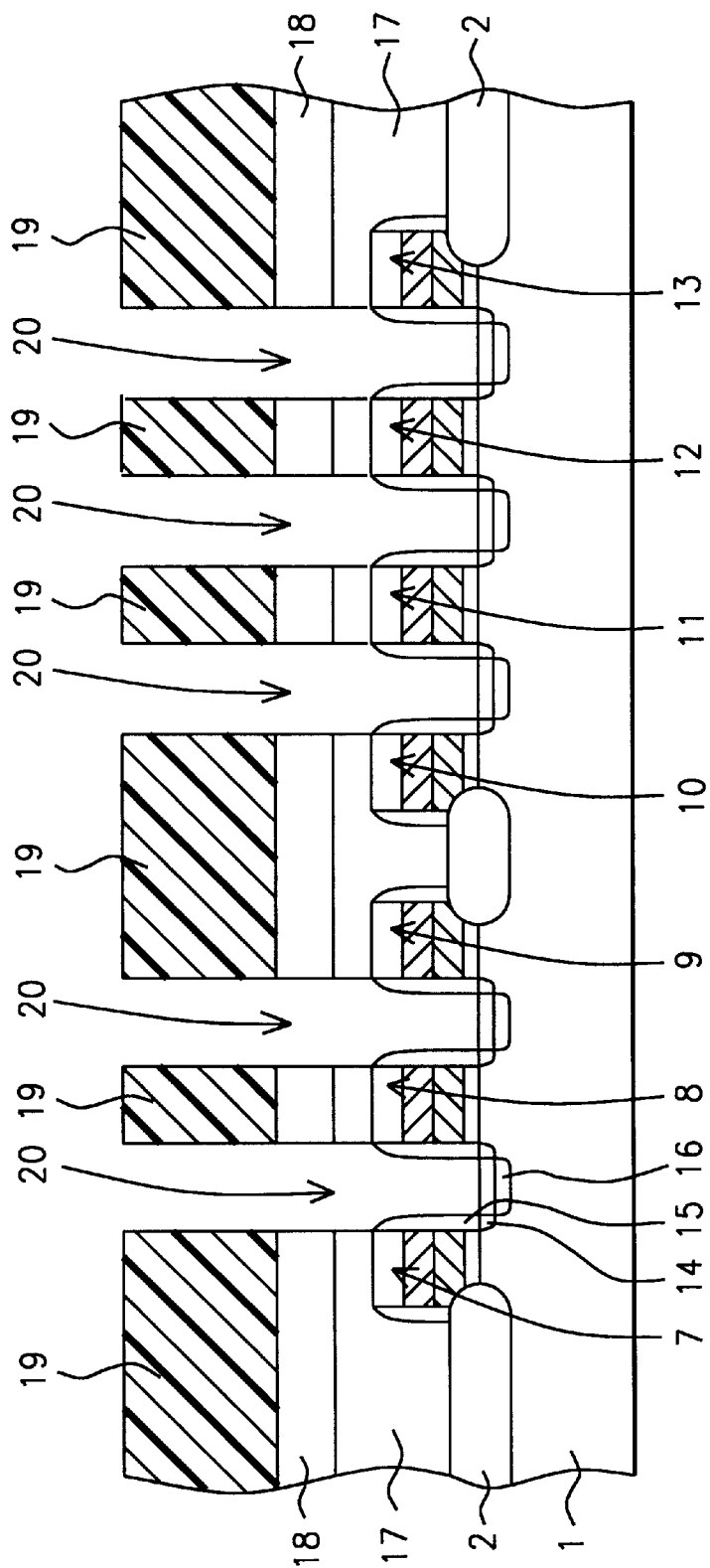

A first interlevel dielectric, (ILD), layer 17, comprised of boro-phosphosilicate glass, (BPSG), is next deposited, using LPCVD or PECVD procedures, to a thickness between about 2000 to 8000 Angstroms, containing between about 0.5 to 3.0 weight % $B_2O_3$, and between about 0.5 to 3.0 weight % $P_2O_5$, obtained via the addition of diborane and phosphine, to a tetraethylorthosilicate, (TEOS), ambient. A chemical mechanical polishing, (CMP), procedure is used for planarization purposes, resulting in a smooth top surface topography for first ILD layer 17, schematically shown in FIG. 4. A second ILD layer 18, again comprised of BPSG, is next deposited, via LPCVD or PECVD procedures, to a thickness between about 1000 to 3000 Angstroms, again using the same concentrations of diborane and phosphine, as well as TEOS, as previously used for first ILD layer 17. Photoresist shape 19, is then used as a mask to allow a selective, anisotropic RIE procedure, using $CHF_3$ as an etchant for second ILD layer 18, and for first ILD layer 17, to create openings 20, between silicon nitride capped, polycide gate structures 7–13, exposing the top surface of heavily doped source/drain region 16. Openings 20, are selectively formed with a width larger then the space between silicon nitride capped, polycide gate structures, accomplished via the ability of silicon nitride capping layer 6, and silicon nitride spacers 15, to withstand the selective, $CHF_3$ RIE procedure. This allows a subsequent polysilicon plug, placed in openings 20, to be self aligned to the silicon nitride capped, polycide gate structures. This is schematically shown in FIG. 5.

Figure 6:
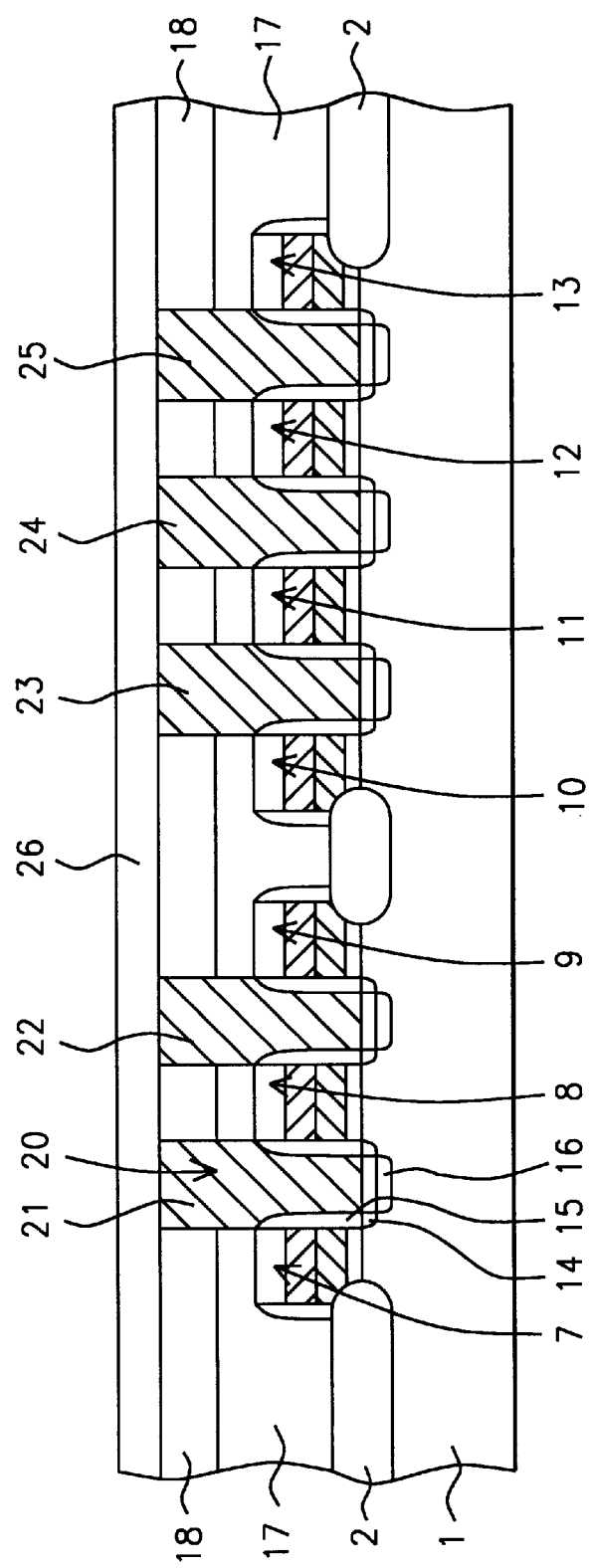

After removal of photoresist shape 19, via plasma oxygen ashing and careful wet cleans, a polysilicon layer is deposited, via LPCVD procedures, to a thickness between about 2000 to 8000 Angstroms, in situ doped during deposition, via the addition of arsine or phosphine, to a silane ambient, completely filling openings 20. Removal of unwanted polysilicon, from the top surface of second ILD layer 18, is accomplished via a CMP procedure, or a selective RIE procedure, using $Cl_2$ as an etchant, resulting in the formation of lower level polysilicon plugs 21–25, in openings 20, schematically shown in FIG. 6. Lower level polysilicon plug 21, and lower level polysilicon plug 24, will subsequently be used for contact between overlying bit line structures, and underlying source/drain regions, while lower level polysilicon plugs 22, 23, and 25, will be used as a component of storage node contact structures, allowing contact between subsequent, overlying capacitor structures, and underlying source/drain regions. A third ILD layer 26, again comprised of BPSG, at a thickness between about 1000 to 3000 Angstroms, containing between about 0.5 to 3.0 weight % $B_2O_3$, and between about 0.5 to 3.0 weight % $P_2O_5$, is deposited via LPCVD or PECVD procedure, using diborane, phosphine, and TEOS.

Figure 7:
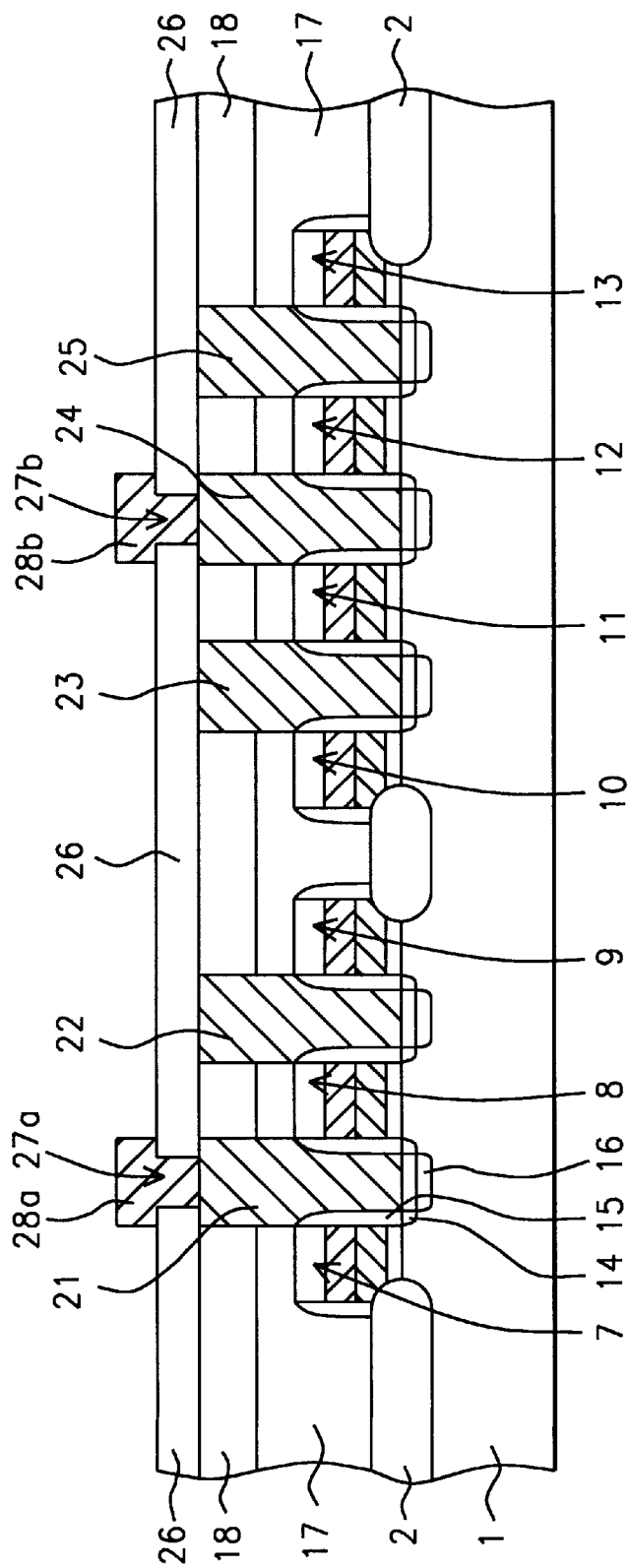

Conventional photolithographic and RIE procedures, using $CHF_3$ as an etchant, are employed to open bit line contact holes 27a and 27b, in third ILD layer 26, exposing the top surfaces of lower level polysilicon plugs 21, and 24, respectfully. After removal of the photoresist shape, used as a mask for the opening of the bit line contact holes, via plasma oxygen ashing and careful wet cleans, a layer of tungsten silicide is deposited, via LPCVD procedures, to a thickness between about 1000 to 4000 Angstroms, using tungsten hexafluoride and silane as reactants, completely filling bit line contact holes 27a and 27b. Another photolithographic and RIE procedure, using $Cl_2$ as an etchant, are used to create bit line structures 28a and 28b, in bit line contact hole 27a and 27b, respectfully, contacting the top surface of lower level polysilicon plug 21, and lower level polysilicon plug 24, respectfully. This is schematically shown in FIG. 7. The photoresist shape, used as the mask for bit line structure definition, is again removed via plasma oxygen ashing and careful wet cleans.

Figure 8:
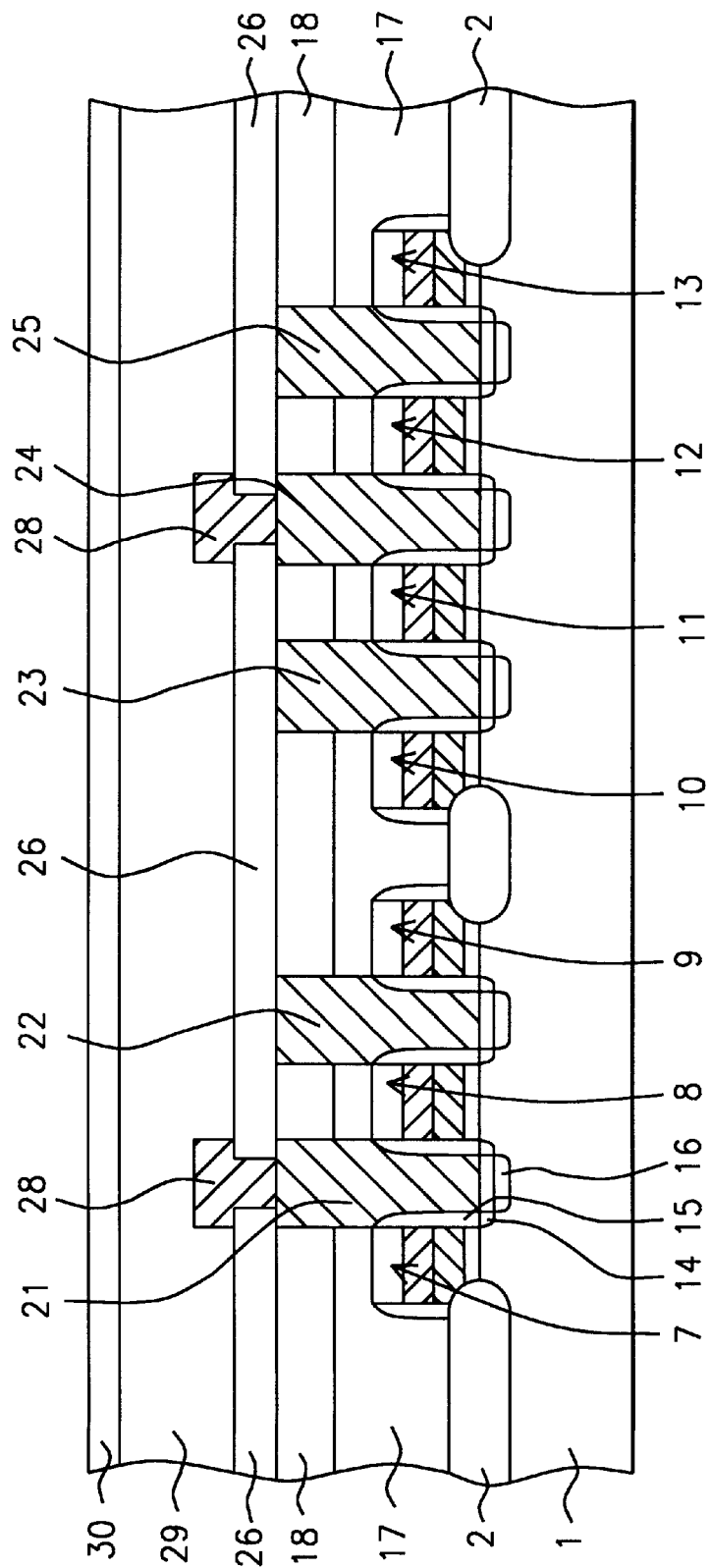
Figure 9:
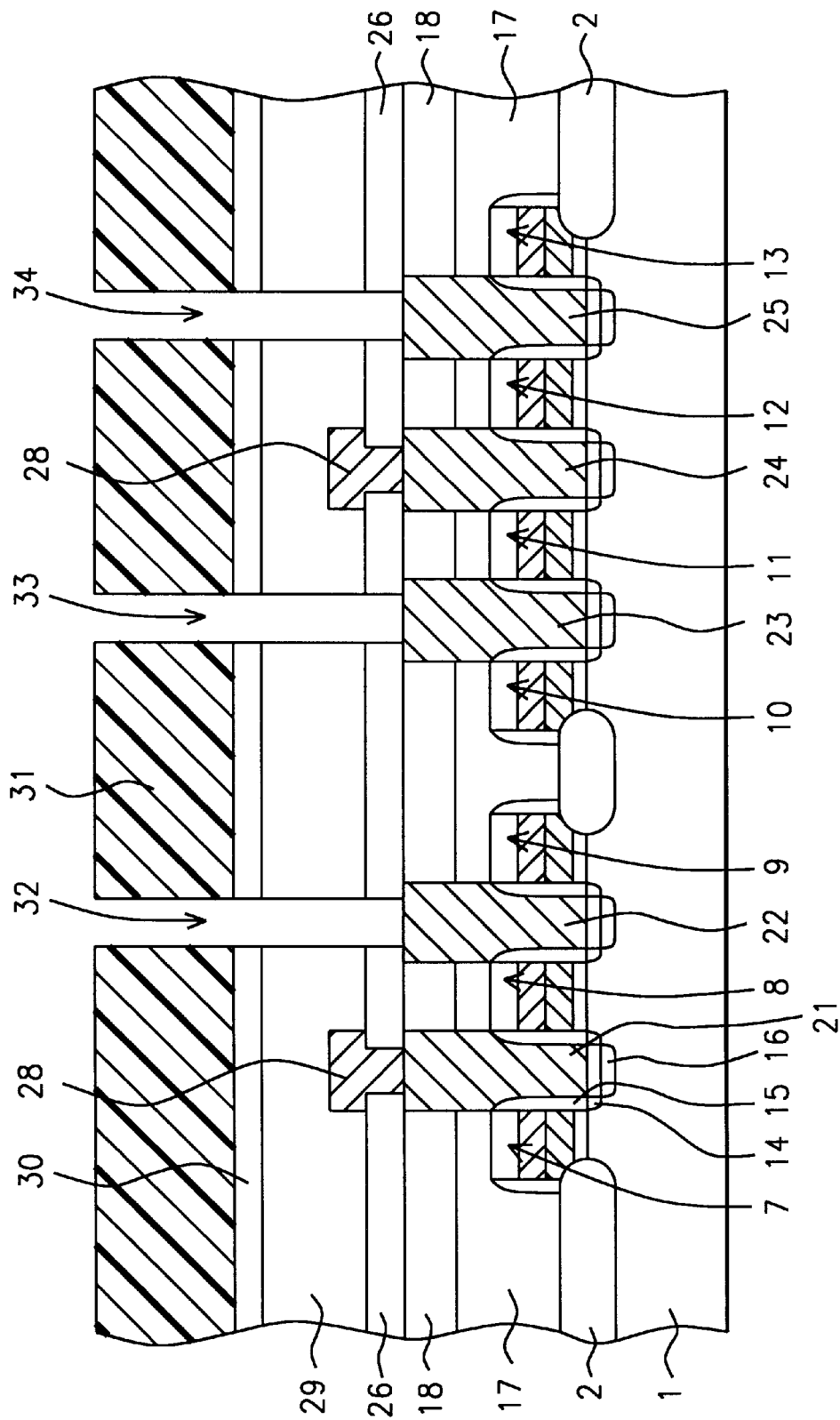
Figure 10:
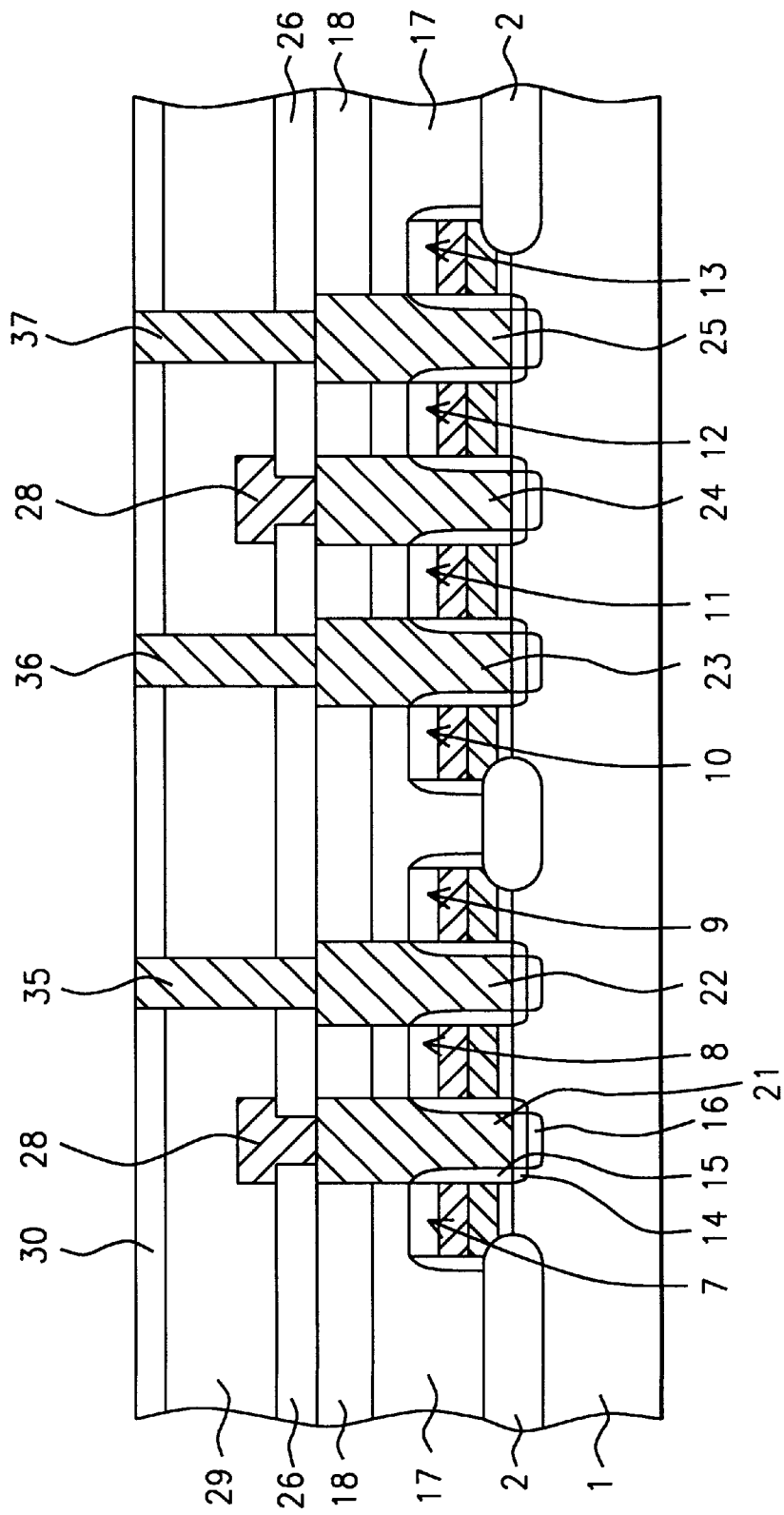

A fourth ILD layer 29, comprised of BPSG, is next deposited using PECVD or LPCVD procedures, to a thickness between about 4000 to 10000 Angstroms, again using diborane, phosphine, and TEOS, to produce a BPSG layer containing between about 0.5 to 3.0 weight % $B_2O_3$, and between about 0.5 to 3.0 weight % $P_2O_5$. A critical layer of silicon oxynitride 30, is next deposited on the top surface of fourth ILD layer 29, via LPCVD or PECVD procedures, at a thickness between about 300 to 1500 Angstroms. Silicon oxynitride layer 30, schematically shown in FIG. 8, to be used as an etch stop for a subsequent capacitor opening procedure, performed in an insulator layer, is obtained using $N_2O$, at a flow between about 30 to 60 sccm, and silane, at a flow between about 60 to 150 sccm, as reactants. Photoresist shape 31, is next used as a mask, to allow an anisotropic RIE procedure, using $Cl_2$ as an etchant for silicon oxynitride layer 30, and using $CHF_3/C_4F_8$ as an etchant for fourth ILD layer 29, and for third ILD layer 26, allowing openings 32, 33, and 34, to be created, exposing the top surface of lower level polysilicon plugs 22, 23, and 25, respectfully. This is schematically shown in FIG. 9. After removal of photoresist shape 31, via plasma oxygen ashing and careful wet cleans, upper level polysilicon plugs 35, 36, and 37, are formed in openings 32, 33, and 34 respectfully. The upper level polysilicon plugs are formed via LPCVD of a polysilicon layer, at a thickness between about 1500 to 4000 Angstroms, completely filling openings 32, 33, and 34, with a polysilicon layer, insitu doped, during deposition, via the addition of arsine or phosphine, to a silane ambient. A CMP, or a selective RIE procedure, using $Cl_2$ as an etchant, is used to remove regions of polysilicon, from the top surface of silicon oxynitride layer 30, creating upper level polysilicon plugs 35, 36, and 37. Upper level polysilicon plugs 35, 36, and 37, overlying lower level polysilicon plugs 22, 23, and 25, respectfully, comprise the storage node contact structure, that will enable a subsequent overlying capacitor structure to communicate with underlying source/drain regions. This is schematically shown in FIG. 10.

Figure 11:
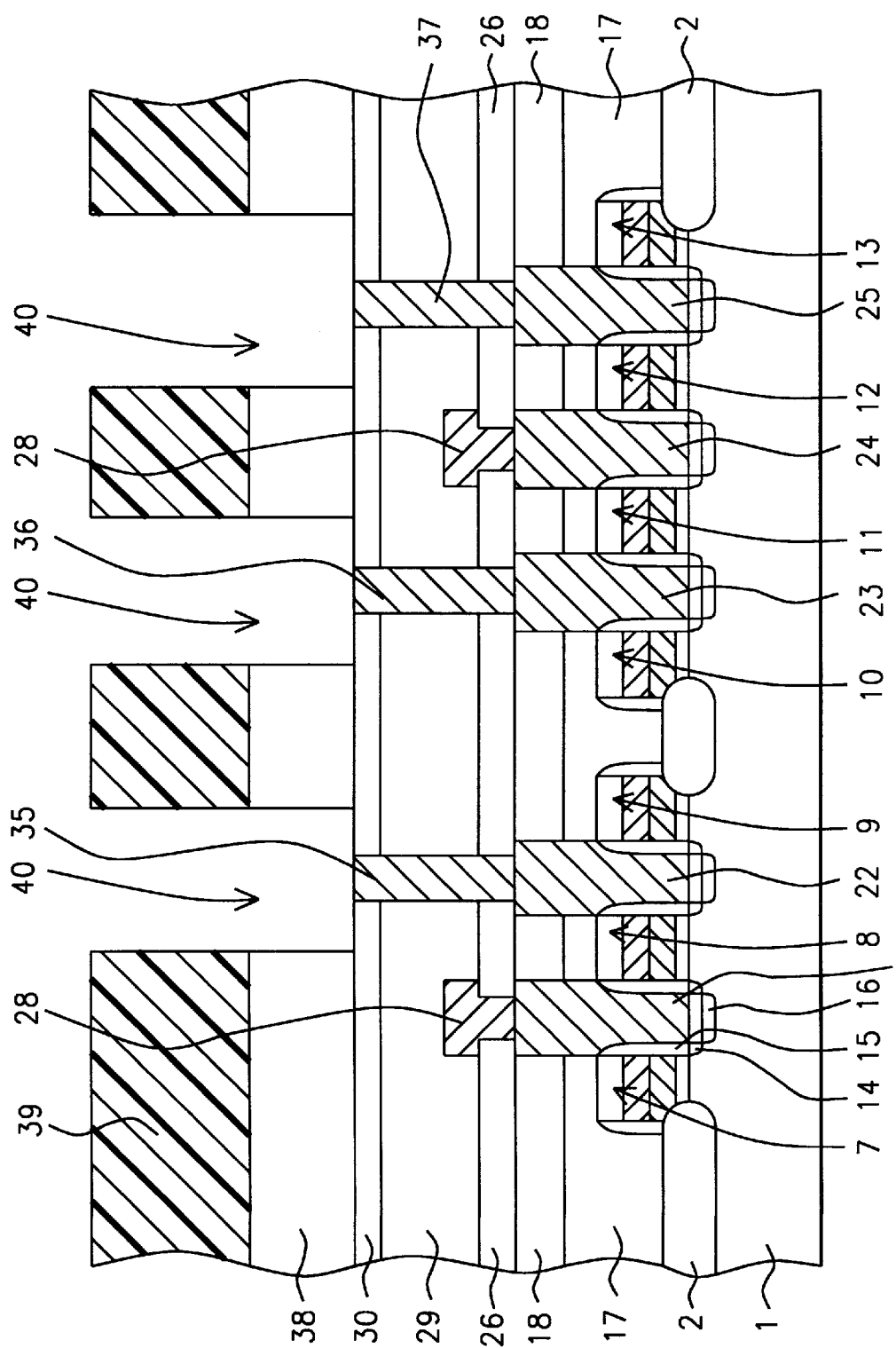

Insulator layer 38, comprised of either silicon oxide, or BPSG, with between about 0.5 to 3.0 weight % $B_2O_3$ and between about 0.5 to 3.0 weight % $P_2O_5$, is next deposited using LPCVD or PECVD procedures, to a thickness between about 8000 to 15000 Angstroms. Photoresist shape 39, is formed, and used as an etch mask to create capacitor openings 40, in insulator 38, via an anisotropic RIE procedure, using $CHF_3$ as an etchant, exposing the top surface of the polysilicon storage node contact structures, comprised upper level polysilicon plugs 35, 36, and 37, and lower level polysilicon plugs 22, 23, and 25. The selectivity of the RIE procedure, using $CHF_3$, allows the removal of exposed insulator layer 38, including an over etch cycle, without removal of the stop layer, silicon oxynitride layer 31, exposed at the conclusion of the RIE procedure. This is schematically shown in FIG. 11. Removal of photoresist shape 39, is accomplished via plasma oxygen ashing and careful wet cleans.

Figure 12:
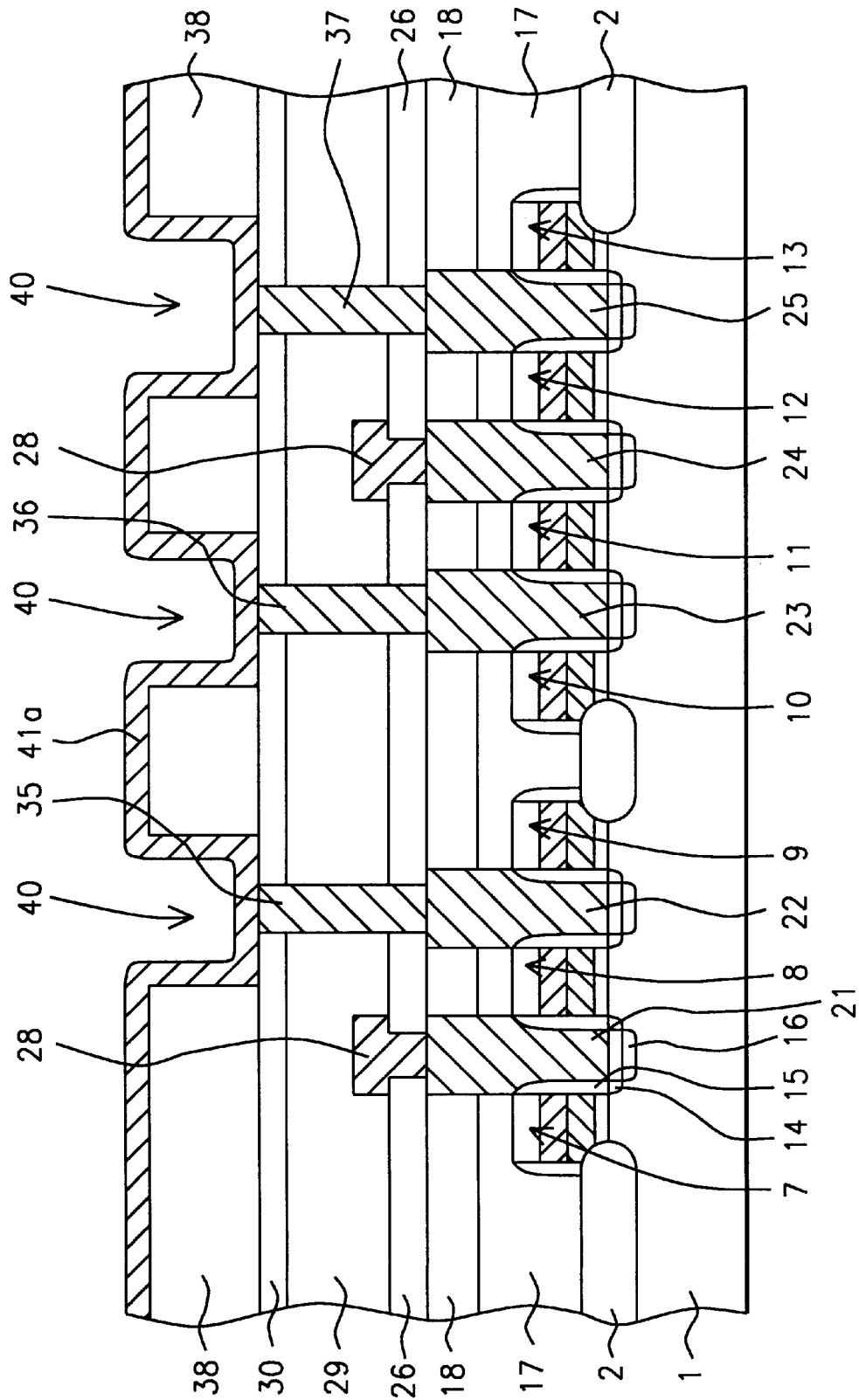
Figure 13:
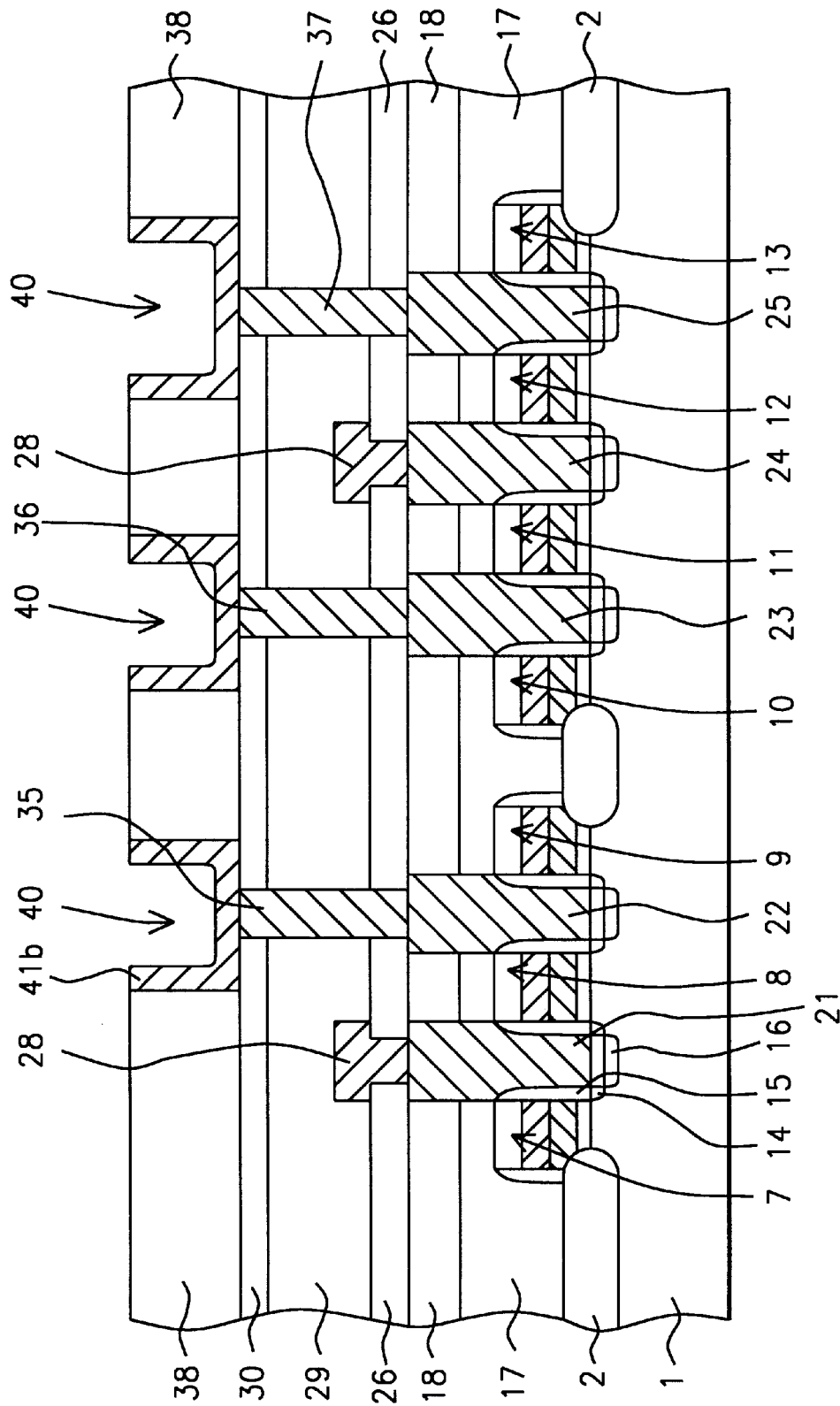
Figure 14:
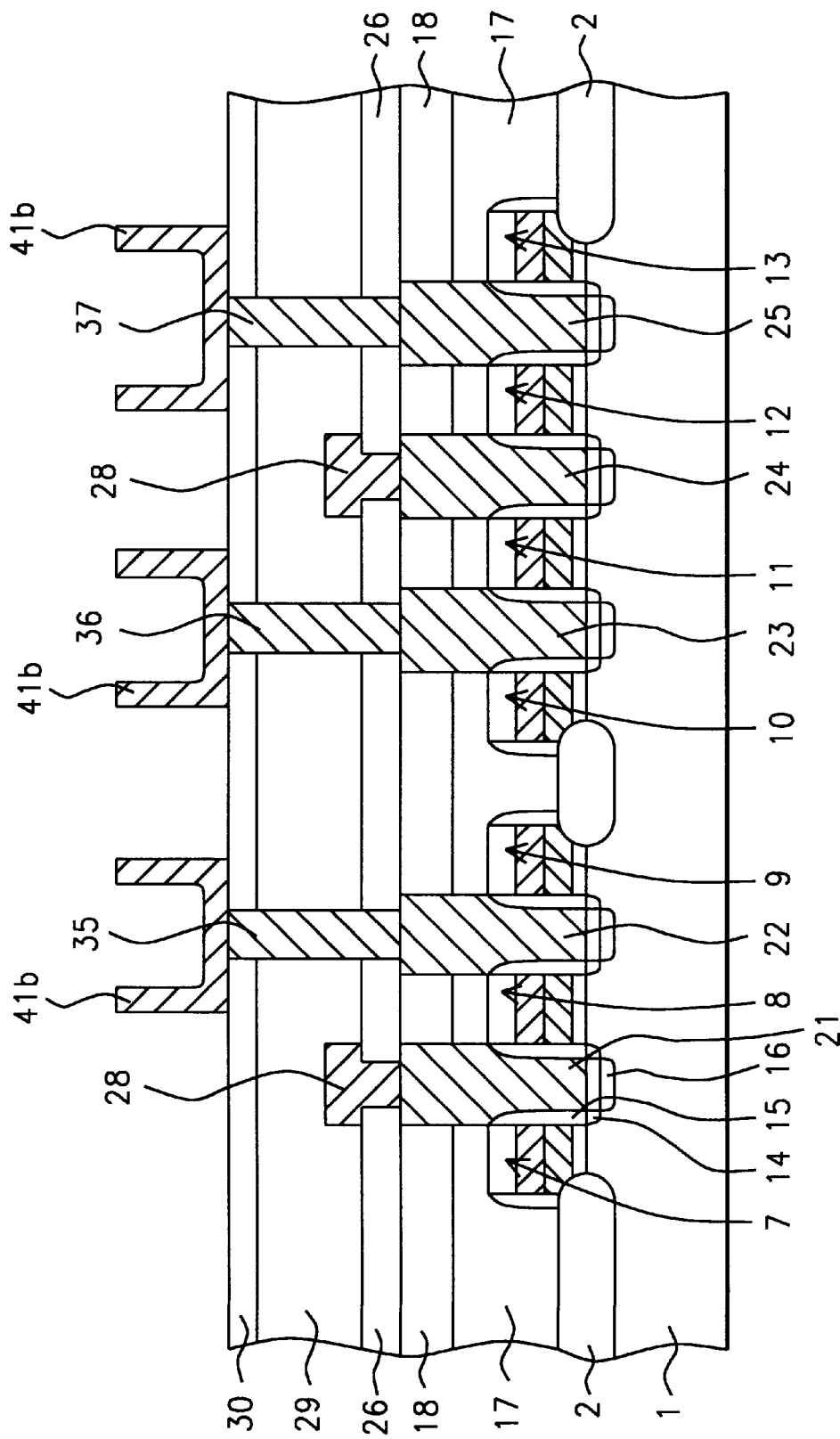

The creation of the crown shaped storage node structures is next addressed and schematically shown in FIGS. 12–14. A polysilicon layer 41a, is deposited, via LPCVD procedures, to a thickness between about 300 to 1500 Angstroms. Polysilicon layer 41a, is doped in situ, during deposition, via the addition of arsine, or phosphine, to a silane ambient. Polysilicon layer 41a, schematically shown in FIG. 12, is deposited conformally on the top surface of insulator layer 38, and on the exposed surfaces of capacitor openings 40, including deposition of polysilicon layer 41a, on the bottom of capacitor opening 40, thus overlying silicon oxynitride layer 30, and contacting the upper level polysilicon plugs. A CMP procedure, next employed, allows the removal of polysilicon layer 41a, from the top surface of insulator layer 38, resulting in individual crown shaped storage node structures 41b, located in capacitor openings 40, with each crown shaped storage node structure, comprised of vertical polysilicon features, on the sides of capacitor openings 40, and connected by a horizontal polysilicon feature, located at the bottom of capacitor openings 40, with the horizontal polysilicon feature overlying silicon oxynitride layer 30, in addition to contacting the top surface of an upper level polysilicon plug. This is schematically shown in FIG. 13. FIG. 14, schematically shows the selective removal of insulator layer 38, via use of a buffered hydrofluoric acid solution. Silicon oxynitride layer 30, not soluble in the buffered hydrofluoric acid solution, protects underlying fourth ILD layer 29, and thus does not allow unwanted exposure of bit line structures, and does not allow undercut of the crown shaped storage node structures, to occur. If desired exposed regions of silicon oxynitride layer 30, can be selectively removed, stopping on the top surface of fourth insulator layer 29. This option reduces the capacitance created by the silicon oxynitride layer.

Figure 15:
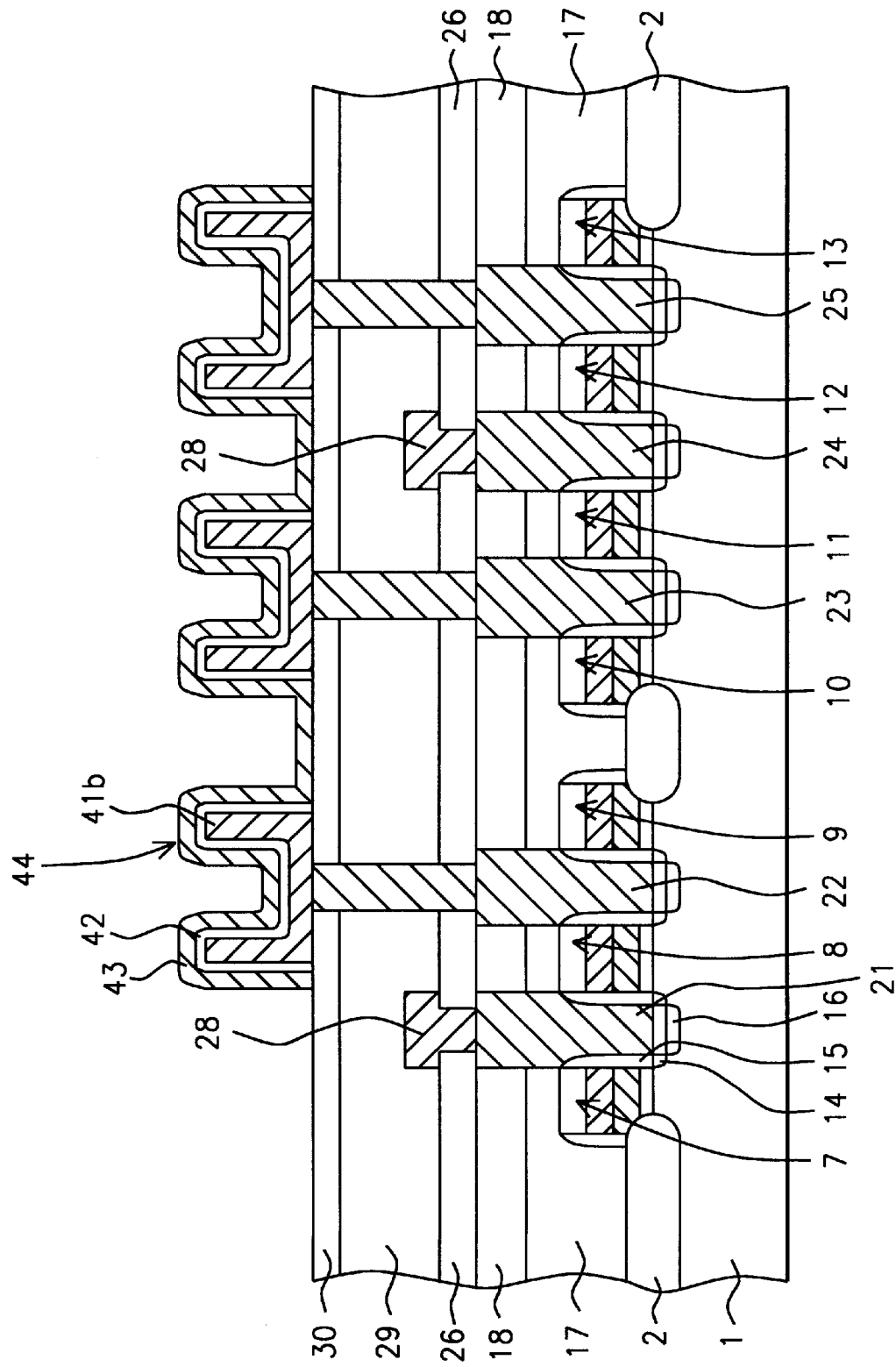

The completion of the DRAM capacitor structure, featuring the crown shaped storage node structure, fabricated on a silicon oxynitride stop layer, is next addressed, and shown schematically in FIG. 15. A capacitor dielectric layer 29, exhibiting a high dielectric constant, such as ONO, (Oxidized—silicon Nitride—silicon Oxide), is next formed on crown shaped storage node structures 41b. The ONO layer is formed by initially growing a silicon dioxide layer, on the polysilicon, crown shaped storage node structures, to a thickness between about 10 to 50 Angstroms, followed by the deposition of a silicon nitride layer, between about 10 to 60 Angstroms. Subsequent thermal oxidation of the silicon nitride layer results in the formation of a silicon oxynitride layer on silicon oxide, at a silicon oxide equivalent thickness of between about 40 to 80 Angstroms. This is schematically shown in FIG. 15. A polysilicon layer, is next deposited, via LPCVD procedures, to a thickness between about 1000 to 2000 Angstroms. The polysilicon layer is in situ doped, during deposition, via the addition of arsine or phosphine, to a silane or disilane ambient. Photolithographic and RIE procedures, using $Cl_2$ as an etchant for polysilicon, is employed to create polysilicon upper electrode structure 43, completing the procedure used to create DRAM capacitor structure 44, schematically shown in FIG. 15 The photoresist shape, used as a mask for patterning of polysilicon upper electrode 43, is once again removed via plasma oxygen ashing and careful wet cleans.

While this invention has been particularly shown and described with reference to the preferred embodiments thereof, it will be understood by those skilled in the art that various changes in form and details may be made without departing from the spirit and scope of this invention.

What is claimed is:

1. A method of fabricating a crown shaped storage node structure, for a DRAM capacitor, on a semiconductor substrate, comprising the steps of:

providing transfer gate transistors, on said semiconductor substrate, with each transfer gate transistor comprised of an insulator capped, polycide gate structure, on a gate insulator layer, with insulator spacers on the sides of each said insulator capped, polycide gate structure, and with a source/drain region in an area of said semiconductor substrate, not covered by the insulator capped, polycide gate structures;

forming a first group of lower level polysilicon plugs, in a second insulator layer, and in an underlying first insulator layer, exposing the top surface of a first group of source/drain regions, to be used for bit line regions;

forming a second group of lower polysilicon plugs, in said second insulator layer, and in said first insulator layer, exposing the top surface of a second group of source/drain regions, to be used for storage node regions;

opening bit line contact holes, in a third insulator layer, exposing the top surface of said first group of lower level polysilicon plugs;

forming bit line structures, in said bit line contact holes, with said bit line structures overlying a portion of the top surface of said third insulator layer;

depositing a fourth insulator layer;

depositing a silicon oxynitride layer on said fourth insulator layer;

forming storage node contact structures, comprised of a group of upper level polysilicon plugs, formed in said silicon oxynitride layer, in said fourth insulator layer, and in said third insulator layer, overlying and contacting said group of lower level polysilicon plugs;

forming capacitor openings, in a fifth insulator layer, with each capacitor opening exposing the top surface of a storage node contact structure, and exposing a portion of the top surface of said silicon oxynitride layer;

forming said crown shaped storage node structure, in each said capacitor opening;

removing said fifth insulator layer, exposing the top surface of said silicon oxynitride layer, in a region in which said silicon oxynitride layer is not covered by said crown shaped storage node structure;

forming a capacitor dielectric layer on said crown shaped storage node structure; and forming an upper electrode structure, on said capacitor dielectric layer.

2. The method of claim 1, wherein said insulator capped, polycide gate structures, are silicon nitride capped, polycide gate structures, where the silicon nitride layer is obtained via an LPCVD or a PECVD procedure, at a thickness between about 600 to 2000 Angstroms.

3. The method of claim 1, wherein said insulator spacers are comprised of silicon nitride, obtained via LPCVD or PECVD procedures, at a thickness between about 1500 to 4000 Angstroms, and formed via an anisotropic RIE procedure using $CF_4$ as an etchant.

4. The method of claim 1, wherein said first insulator layer is a boro-phosphosilicate glass, (BPSG), layer, obtained via LPCVD or PECVD procedures, to a thickness between about 2000 to 8000 Angstroms, containing between about 0.5 to 3.0 weight % $B_2O_3$, and between about 0.5 to 3.0 weight % $P_2O_5$.

5. The method of claim 1, wherein said second insulator layer is a BPSG layer, obtained via LPCVD or PECVD procedures, to a thickness between about 1000 to 3000 Angstroms, containing between about 0.5 to 3.0 weight % $B_2O_3$, and between about 0.5 to 3.0 weight % $P_2O_5$.

6. The method of claim 1, wherein said first group of lower level polysilicon plugs, and said second group of said lower level polysilicon plugs, are formed via deposition of a polysilicon layer, obtained via LPCVD procedures, to a thickness between about 2000 to 8000 Angstroms, and doped in situ, via the addition of phosphine, or arsine, to a silane ambient, and patterned via a chemical mechanical polishing procedure, or via a selective, anisotropic RIE procedure, using $Cl_2$ as an etchant.

7. The method of claim 1, wherein said third insulator layer is a BPSG layer, obtained via LPCVD or PECVD procedures, at a thickness between about 1000 to 3000 Angstroms, containing between about 0.5 to 3.0 weight % $B_2O_3$, and between about 0.5 to 3.0 weight % $P_2O_5$.

8. The method of claim 1, wherein said bit line structures are comprised of tungsten silicide, obtained via LPCVD procedures, to a thickness between about 1000 to 4000 Angstroms, using silane and tungsten hexafluoride as reactants, and patterned via an anisotropic RIE procedure, using $Cl_2$ as an etchant.

9. The method of claim 1, wherein said fourth insulator layer, is a BPSG layer, obtained via LPCVD or PECVD procedures, at a thickness between about 4000 to 10000 Angstroms, containing between about 0.5 to 3.0 weight % $B_2O_3$, and between about 0.5 to 3.0 weight % $P_2O_5$.

10. The method of claim 1, wherein said silicon oxynitride layer is deposited via LPCVD or PECVD procedures, at a thickness between about 300 to 1500 Angstroms, using silane, at a flow between about 60 to 150 sccm, and $N_2O$, at a flow between about 30 to 60 sccm, as reactants.

11. The method of claim 1, wherein said group of upper level polysilicon plugs are comprised with polysilicon, obtained via an LPCVD procedure, to a thickness between about 1500 to 4000 Angstroms, and insitu doped, during deposition, via the addition of arsine, or phosphine, to a silane ambient.

12. The method of claim 1, wherein said fifth insulator layer is a silicon oxide layer, obtained via LPCVD or PECVD procedures, to a thickness between about 8000 to 15000 Angstroms.

13. The method of claim 1, wherein said fifth insulator layer is a BPSG layer, obtained via LPCVD or PECVD procedures, at a thickness between about 8000 to 15000 Angstroms, containing between about 0.5 to 3.0 weight % $B_2O_3$, and between about 0.5 to 3.0 weight % $P_2O_5$.

14. The method of claim 1, wherein said capacitor openings are formed in said fifth insulator layer via an anisotropic RIE procedure, using $CHF_3$ as an etchant.

15. The method of claim 1, wherein said crown shaped storage node structure, is comprised from a polysilicon layer, obtained via LPCVD procedures, to a thickness between about 500 to 1500 Angstroms, and in situ doped, during deposition, via the addition of phosphine, or arsine, to a silane ambient, and with said crown shaped storage node structure, patterned via removal of said polysilicon layer, from the top surface of said fifth insulator layer, via a chemical mechanical polishing procedure.

16. The method of claim 1, wherein said fifth insulator layer, is removed from underlying, said silicon oxynitride layer, via use of a buffered hydrofluoric acid solution.

17. A method of fabricating a crown shaped storage node structure, for a DRAM capacitor structure, featuring the use of a silicon oxynitride layer, underlying said crown shaped storage node structure, comprising the steps of:

providing transfer gate transistors on a semiconductor substrate, with each transfer gate transistor comprised of a silicon nitride capped, polycide gate structure, on an underlying gate insulator layer, with silicon nitride spacers on the sides of said silicon nitride capped, polycide gate structure, and with source/drain regions, located in areas of said semiconductor substrate, not covered by said silicon nitride capped, polycide gate structure;

depositing a first boro-phosphosilicate glass, (BPSG), layer;

planarizing said first BPSG layer;

depositing a second BPSG layer;

opening a first group of contact holes, in said second BPSG layer, and in said first BPSG layer, exposing a first group of source/drain regions, to be used for bit line regions;

opening a second group of contact holes, in said second BPSG layer, and in said first BPSG layer, exposing a second group of source/drain regions, to be used for storage node regions;

depositing a first polysilicon layer;

patterning of said first polysilicon layer to create a first group of lower level polysilicon plug, in said first group of contact holes, and to create a second group of lower level polysilicon plugs, in said second group of contact holes;

depositing a third BPSG layer;

opening bit line contact holes in said third BPSG layer, exposing a portion of the top surface of said first group of lower level polysilicon plugs;

depositing a tungsten silicide layer;

patterning of said tungsten silicide layer to form bit line structures, in said bit line contact holes, with said bit line structures overlying a portion of the top surface of said third BPSG layer;

depositing a fourth BPSG layer;

depositing said silicon oxynitride layer, on said fourth BPSG layer;

opening via holes in said silicon oxynitride layer, in said fourth BPSG layer, and in said third BPSG layer, exposing a portion of the top surface of said second group of lower level polysilicon plugs;

depositing a second polysilicon layer;

patterning of said second polysilicon layer, to form upper level polysilicon plugs, in said via holes, resulting in storage node contact structures, comprised of said upper level polysilicon plugs, overlying said second group of lower level polysilicon plugs;

depositing a fifth BPSG layer;

creating capacitor openings in said fifth insulator layer, exposing the top surface of said upper level polysilicon plugs, and exposing a portion of the top surface of said silicon oxynitride layer;

depositing a third polysilicon layer: on the top surface of said fifth BPSG layer; on the vertical sides of the capacitor openings; and on said top surface of said upper level polysilicon plugs, and on the portion of said silicon oxynitride layer, exposed at the bottom of said capacitor openings;

removing said third polysilicon layer from the top surface of said fifth BPSG layer, creating said crown shaped storage node structures, located in said capacitor openings, comprised of vertical polysilicon shapes, on the sides of each capacitor opening, and comprised of a horizontal polysilicon shape, at the bottom of each capacitor opening, connecting said vertical polysilicon shapes, and with said horizontal polysilicon shape, overlying and contacting the top surface of an upper level polysilicon plug;

selectively removing said fifth BPSG layer, from the portion of said silicon oxynitride layer, not covered by said crown shaped storage node structures;

forming a capacitor dielectric layer on each crown shaped storage node structure; and forming a polysilicon upper electrode, for said DRAM capacitor structure.

18. The method of claim 17, wherein said first BPSG layer is obtained via LPCVD or PECVD procedures, to a thickness between about 2000 to 8000 Angstroms, using diborane, phosphine, and TEOS as reactants, and resulting in said first BPSG layer containing between about 0.5 to 3.0 weight % $B_2O_3$, and between about 0.5 to 3.0 weight % $P_2O_5$.

19. The method of claim 17, wherein said second BPSG layer is obtained using LPCVD or PECVD procedures, to a thickness between about 1000 to 3000 Angstroms, containing between about 0.5 to 3.0 weight % $B_2O_3$, and between about 0.5 to 3.0 weight % $P_2O_5$.

20. The method of claim 17, wherein said first polysilicon layer is obtained using an LPCVD procedure, at a thickness between about 2000 to 8000 Angstroms, and doped in situ, during deposition, via the addition of phosphine or arsine, to a silane ambient.

21. The method of claim 17, wherein said first group of lower level polysilicon plugs, and said second group of lower level polysilicon plugs, are formed via patterning of said first polysilicon layer, using either a CMP procedure, or via a selective RIE procedure, using $Cl_2$ as an etchant.

22. The method of claim 17, wherein said third BPSG layer is obtained via LPCVD or PECVD procedures, to a thickness between about 1000 to 3000 Angstroms, containing between about 0.5 to 3.0 weight % $B_2O_3$, and between about 0.5 to 3.0 weight % $P_2O_5$.

23. The method of claim 17, wherein said tungsten silicide layer is obtained via LPCVD procedures, to a thickness between about 1000 to 4000 Angstroms, using silane and tungsten hexafluoride as reactants.

24. The method of claim 17, wherein said bit line structures are formed via an anisotropic RIE procedure, applied to said tungsten silicide layer, using $Cl_2$ as an etchant.

25. The method of claim 17, wherein said fourth BPSG layer is obtained via LPCVD or PECVD procedures, to a thickness between about 4000 to 10000 Angstroms, containing between about 0.5 to 3.0 weight % $B_2O_3$, and between about 0.5 to 3.0 weight % $P_2O_5$.

26. The method of claim 17, wherein said silicon oxynitride layer is deposited using LPCVD or PECVD procedures, to a thickness between about 300 to 1500 Angstroms, using silane, at a flow between about 60 to 150 sccm, and $N_2O$, at a flow between about 30 to 60 sccm, as reactants.

27. The method of claim 17, wherein said second polysilicon layer is obtained via LPCVD procedures, to a thickness between about 1500 to 4000 Angstroms, and doped in situ during deposition, via the addition of phosphine or arsine, to a silane ambient.

28. The method of claim 17, wherein said upper level polysilicon plugs are formed via patterning of said second polysilicon layer, using either a CMP procedure, or via a selective RIE procedure, using $Cl_2$ as an etchant.

29. The method of claim 17, wherein said fifth BPSG layer is obtained via LPCVD or PECVD procedures, at a thickness between about 8000 to 15000 Angstroms, containing between about 0.5 to 3.0 weight % $B_2O_3$, and between about 0.5 to 3.0 weight % $P_2O_5$.

30. The method of claim 17, wherein said capacitor openings are selectively formed in said fifth BPSG layer, via an anisotropic RIE procedure, using $CHF_3$ as an etchant.

31. The method of claim 17, wherein said third polysilicon layer, used for said crown shaped storage node structures, is deposited using LPCVD procedures, to a thickness between about 500 to 1500 Angstroms, and doped in situ, during deposition, via the addition of arsine, or phosphine, to a silane ambient.

32. The method of claim 17, wherein said crown shaped storage node structures, are formed via removal of said third polysilicon layer, from the top surface of said fifth BPSG layer, via a CMP procedure.

33. The method of claim 17, wherein said fifth BPSG layer is selectively removed from said silicon oxynitride layer, using a buffered hydrofluoric acid solution.

* * * * *